United States Patent [19]

Fernandes

[11] Patent Number: 4,758,962
[45] Date of Patent: Jul. 19, 1988

[54] ELECTRICAL POWER LINE AND SUBSTATION MONITORING APPARATUS AND SYSTEMS

[76] Inventor: Roosevelt A. Fernandes, 104 Ruby Rd., Liverpool, N.Y. 13088

[21] Appl. No.: 859,496

[22] Filed: May 5, 1986

Related U.S. Application Data

[63] Continuation-in-part of Ser. No. 484,681, Apr. 13, 1983, Pat. No. 4,689,752, and Ser. No. 795,226, Nov. 5, 1985, abandoned.

[51] Int. Cl.[4] .................... G01R 19/00; G08B 21/00
[52] U.S. Cl. .................... 364/483; 324/127; 340/657; 340/870.17; 364/492
[58] Field of Search .................. 364/464, 492, 483; 324/17, 127, 133; 340/538, 539, 657, 870.17, 870.38

[56] References Cited

U.S. PATENT DOCUMENTS

| | | | |
|---|---|---|---|
| 3,453,544 | 7/1969 | Schweitzer, Jr. | 324/127 |
| 4,158,810 | 6/1979 | Leskovar | 340/870.17 |
| 4,384,289 | 5/1983 | Stillwell et al. | 340/870.17 |
| 4,415,896 | 11/1983 | Allgood | 324/127 |
| 4,420,752 | 12/1983 | Davis et al. | 340/870.17 |

Primary Examiner—Felix D. Gruber
Assistant Examiner—Kevin J. Teska
Attorney, Agent, or Firm—Charles S. McGuire

[57] ABSTRACT

An electrical power monitoring and control system including individual sensor modules for mounting directly upon energized electrical power conductors and systems employing such modules, with principal emphasis upon the provision of both data transmitting and receiving means in each sensor module and at an associated ground station. The modules sense the instantaneous values of all parameters necessary to perform complete metering functions and, in one embodiment, are synchronized by a signal transmitted from the ground station and received by all modules so that the values are measured simultaneously on all conductors at a substation. The signals are transmitted by the modules in a time-synchronized manner and are in a condition for use directly by the ground station microprocessor. In another embodiment, data transmissions by a plurality of modules is synchronized to avoid data collisions by self-contained means within each module, requiring no synchronizing signal from the ground station. The modules preferably include a reliable battery back-up system, requiring essentially no removal and/or replacement of batteries for recharging, for providing power to the module electronics when there is little or no current flowing through the associated conductor.

28 Claims, 13 Drawing Sheets

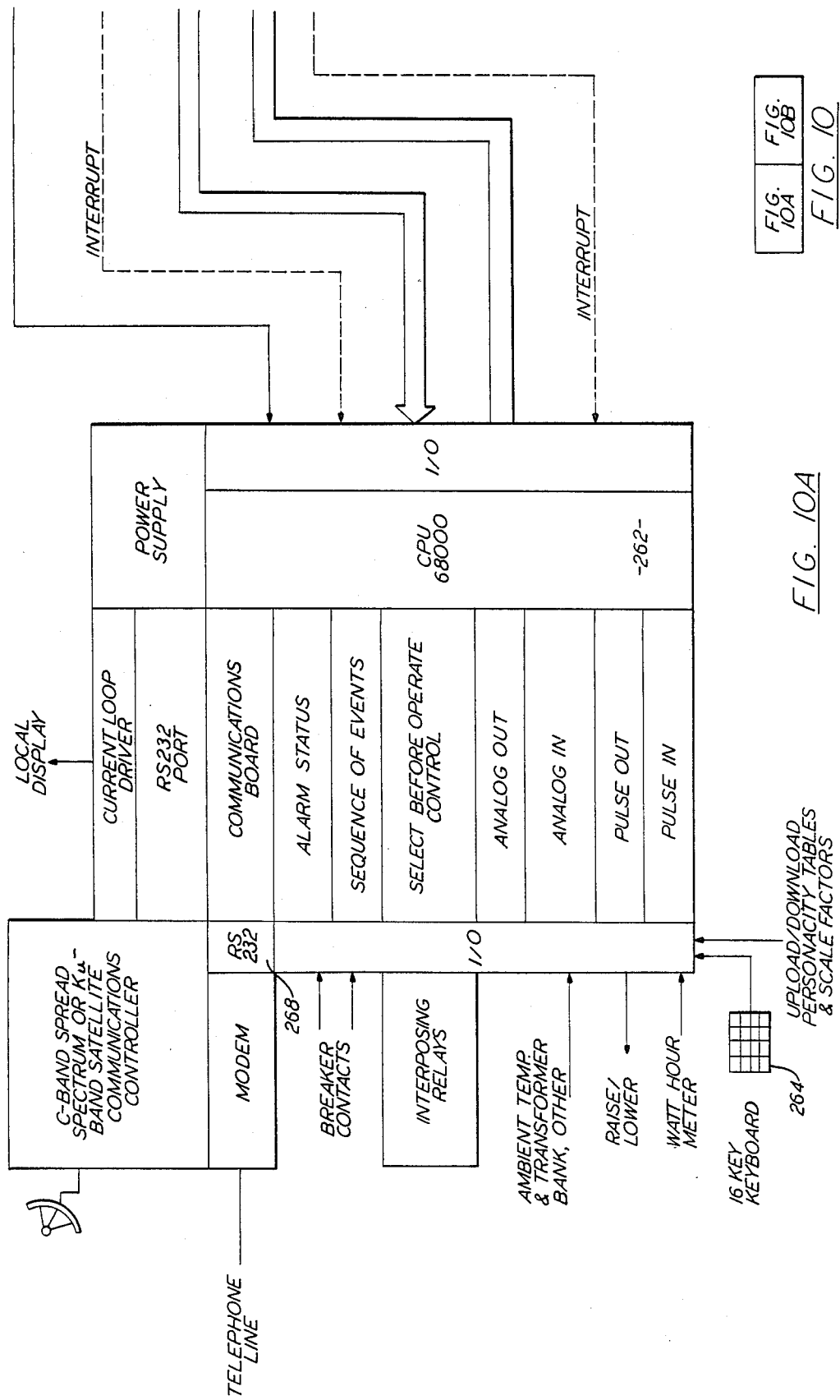

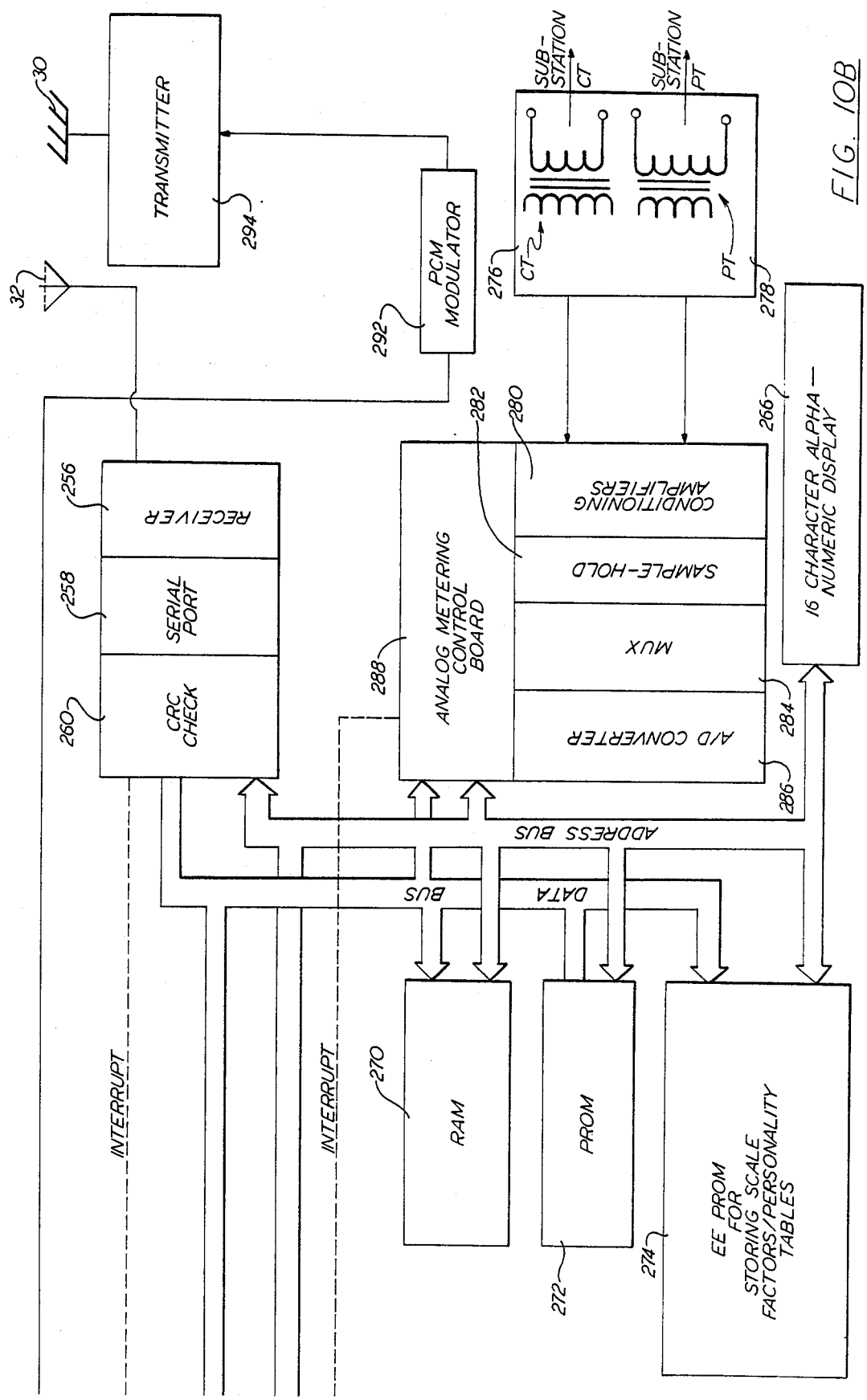

ELECTRICAL POWER LINE AND SUBSTATION MONITORING APPARATUS AND SYSTEMS

CROSS REFERENCE TO RELATED APPLICATIONS

This application is a continuation-in-part of copending applications Ser. No. 484,681, filed April 13, 1983 and issued as U.S. Pat. No. 4,689,742, and Ser. No. 795,226 filed Nov. 5, 1985 now abaandoned.

BACKGROUND OF THE INVENTION

This invention relates to apparatus for measuring operating parameters of high voltage power conductors and, more particularly, to systems employing sensors which are mounted on overhead power transmission lines for measuring all parameters necessary to monitor operation of single phase circuits, three phase circuits, and an entire electrical power substation. The sensors normally derive their power as a result of current flowing through the power conductor, and the invention further relates to back-up power means for operating the sensors when there is little or no current flow through the conductor.

Various power line sensors have been disclosed in the prior art. For example, the sensors of U.S. Pat. Nos. 3,428,896, 3,633,191, 4,158,810, 4,268,818 and 4,384,289 have been proposed for dynamic line rating of electrical power transmission lines. The power line sensor systems available in the prior art measure certain quantities associated with the operation of an individual overhead conductor, namely, current flow in the conductor, conductor temperature and ambient temperature. The limited information gathered by a single sensor module is transmitted to a local ground station dedicated to that sensor module. Data from various ground receivers is transmitted to a central control station where the information is analyzed.

Sensor modules of the prior art, although providing a means of measuring certain operating parameters of individual conductors, do not provide a means for simultaneous measurement of multiple parameters and communication of data from several sensor modules to a single ground receiving station. Thus, prior art sensors for monitoring transmission lines have not had the capability of simultaneously and accurately measuring voltage, current and phase angle on a single phase or cooperatively on all conductors of a 3-phase circuit. Likewise, prior art systems employing line-mounted sensor modules do not have the capability of measuring and communicating all operating parameters involved in monitoring an entire substation through a single, microprocessor controlled ground station receiving data from a plurality of sensors. It has therefore remained necessary to provide substation monitoring in the conventional manner, i.e., by means of individual current and potential transformers on each conductor at a substation where each transformer is hard-wired to auxiliary transformers on the ground wherein the signals are converted to a level compatible with various transducers. Individual transducers are required to measure each parameter, such as voltage, current, kilowatts. These signals then pass through an array of test switches and terminal blocks which in turn are hard-wired to a Remote Terminal Unit (RTU).

It is a principal object of the present invention to provide a sensor module for mounting directly upon an energized power conductor and capable of measuring simultaneously the voltage, current, frequency, phase angle and other parameters on the associated conductor and communicating the values thereof to a receiving station. The received signals may be further processed to provide other data associated with a single phase or with one or more 3-phase circuits.

It is a further object to provide an integrated system for monitoring parameters associated with operation of an entire electrical power substation using only line-mounted modules, each capable of simultaneously sensing the voltage, current and phase angle on the associated conductor at a predetermined time and communicating the measured quantities to a single ground station microprocessor. The sensor modules, of course, are of a type which may be mounted directly upon energized conductors, requiring no shut down of the circuit during installation. Furthermore, the signals communicated from the modules to the ground station are in a condition for use directly by the microprocessor, thereby eliminating the need for auxiliary transformers, transducers, and the like, necessary for signal conditioning and processing in prior art substation monitoring systems.

Prior art sensor modules, such as the toroidal-shaped modules of previously mentioned U.S. Pat. No. 4,384,289, derive their operating power directly from the conductors upon which they are mounted. Consequently, they are operable only when the line current of the conductor is at or above the minimum value necessary to power the sensor electronics. In a substation monitoring system of the type contemplated by the present invention, it is necessary that the sensor modules also be operable when line currents are below the threshold level, i.e., for monitoring very low current conditions or detection of energized conductors with zero current flow. Therefore, it is an ancillary object of the invention to provide a reliable power back-up system, requiring essentially no removal and/or replacement of batteries for recharging, for operating line-mounted sensor modules.

In a system where a plurality of modules transmit data to a single receiver it is desireable to provide means for insuring that more than one sensor is not transmitting at any given time. It has been proposed to transmit signals in bursts of finite duration at random times, but there is still the possibility that more than one sensor will be transmitting at a given time. It is an additional object of the present invention to provide means for time synchronizing data transmissions from a plurality of sensor modules so that no two modules are transmitting at the same time.

Furthermore, it is an object of the invention to achieve this through self-contained means within each module precluding need for communication between modules or requiring a synchronizing signal from the ground station, called the combined CRTU.

Other objects, related to the foregoing, will in part be obvious and will in part appear hereinafter.

SUMMARY OF THE INVENTION

The present invention contemplates a power monitoring system comprising a sensor module capable of simultaneously measuring the voltage, current and phase angle and other parameters of a power conductor (or in its vicinity e.g. ambient conditions) upon which the module is mounted and for communicating such data to a ground station. The invention may be expanded to include systems wherein one such module is mounted upon each conductor to be monitored at a power substation with self-contained synchronization means or means such as, RF receivers of power line carrier coupling provided to cause all sensors in the system to measure the values of voltage, current, phase angle and frequency, on the associated conductors simultaneously at predetermined times. The sensor modules are connected by a communications link, such as RF transmitters and receivers, to the ground station and are adapted to convey signals commensurate with the measured parameters sequentially to appropriate signal receiving means on the ground. The signals in their as-received condition are suitable for supply to a microprocessor wherein all desired quantities which may be derived from the values of voltage, current and phase angle of the various conductors, such as, megawatts, megawatt-hours, megavars, power factor, etc., are developed and the resulting information is communicated with other information in a manner similar to a conventional RTU but employing a single microprocessor. Thus, the invention eliminates the need not only for current and potential transformers wired from the respective conductors to auxiliary transformers on the ground, but also an array of transducers, test switches, terminal blocks and hard wiring representing literally tons of equipment previously required for monitoring operation of an electrical power substation.

The sensor modules also preferably include electrostatially or electromagnetically line powered, rechargeable battery back-up facility for powering the module electronics when there is minimal or zero current on the conductor upon which the module is mounted. Current sensing circuitry in the module monitors the level of current on the conductor to establish whether the current is above or below a predetermined threshold value. When current is above this value, the sensor is powered by electromagnetic induction from the conductor, which also serves to float charge the battery. When line current is below the threshold value, or when the conductor is energized but current is zero, as determined by voltage sensing circuitry, power is supplied to the sensor by the battery. If the zero current condition persists beyond a predetermined time limit, battery control circuitry and a processor in the sensor module operate to reduce the frequency of data transmission from the module to the ground station receiver, thus conserving battery power. If battery voltage drops below a predetermined level, all battery-powered transmission is stopped until the batteries are sufficiently recharged. Also, when current on the conductor is at or above zero but below the threshold level, the battery is float charged electrostatically between data transmissions.

BRIEF DESCRIPTION OF THE DRAWINGS

FIG. 7A is a schematic diagram of an alternate voltage sensing means;

FIG. 10 indicates the relationship of the sheets containing FIGS. 10A and 10B to form a single block diagram;

FIGS. 10A and 10B form a composite block diagram of the ground station electronics.

Detailed Description

Figure 1:
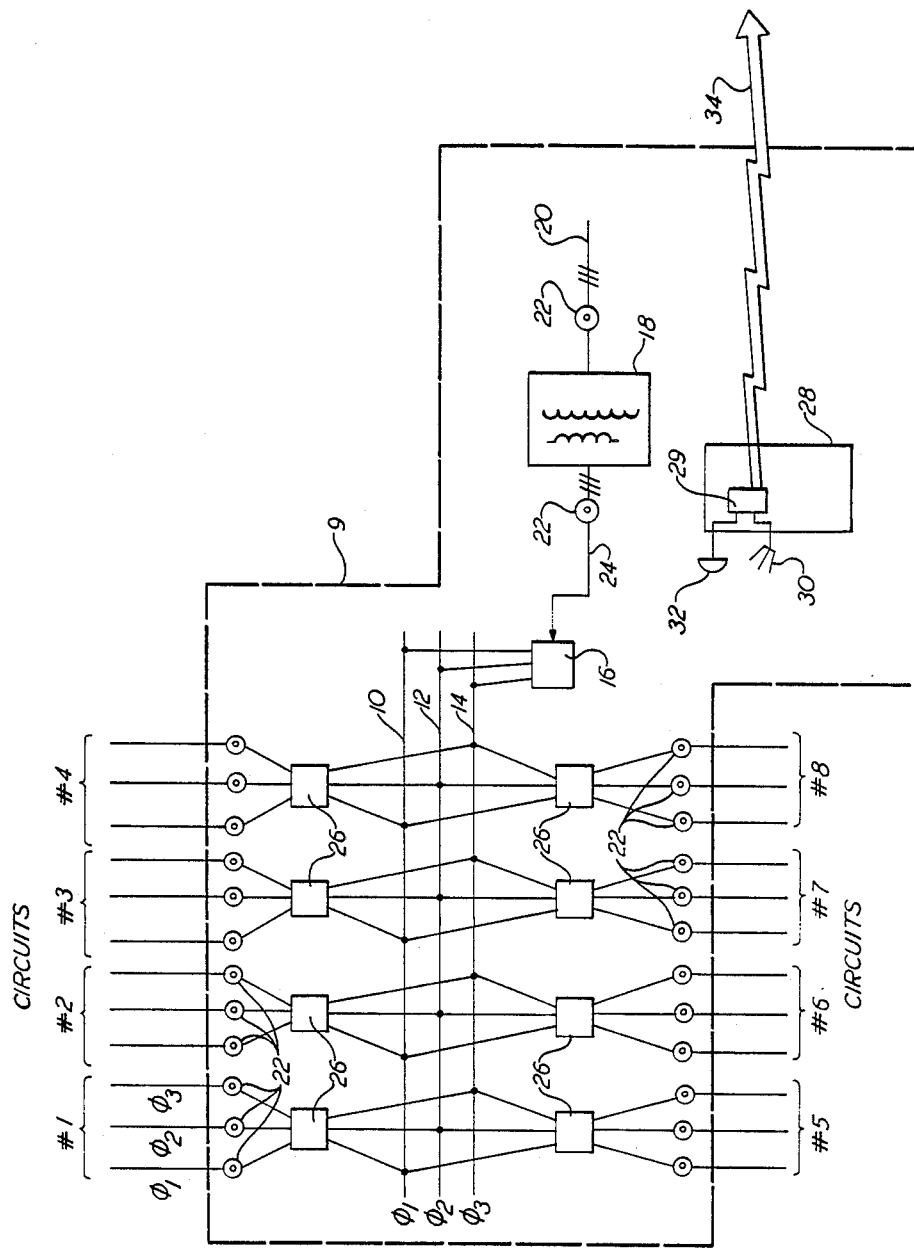
FIG. 1 is a diagrammatic illustration of a typical electric power substation incorporating the present invention.

Referring now to the drawings, in FIG. 1 is shown a diagrammatic representation of an electrical power substation enclosed by station fence 9, employing the present invention. A plurality of three phase circuits, numbered 1-8, are fed from a common bus comprising three phases 10, 12 and 14, each connected through circuit breaker 16 to transformer bank 18. The latter is fed by an incoming three-phase power circuit comprising three conductors denoted collectively by reference numeral 20. Sensor modules indicated generally by reference numeral 22, and having a structure and operation described later in more detail, are mounted upon each of the three phases of line 20, and of line 24, connecting transformer bank 18 to breakers 16. Conductors for each phase of all 3-phase circuits emanating from the substation are equipped with a line-mounted sensor module 22. Conventional circuit breakers 26 are interposed in each circuit between its respective connection to the common bus phase and the associated sensor modules 22.

In one embodiment each sensor module is programmed to transmit data in a 4.5 millisec burst at say the positive zero crossing of the voltage waveform for each phase of a circuit. Data transmissions are repeated at say every 7th cycle. On the same transmission frequency other circuit modules transmit on the 9th, 13th, 17th cycle etc. To accommodate larger number of circuits and 1 sec data refresh intervals, alternate circuit modules could be made to transmit on a second frequency in a 4.5 milli-sec. burst with respect to the negative voltage zero-crossing with repetition rates as above. This is done for all circuits tied to a given bus. For separate buses within a station additional frequencies are used, but, with the same synchronization and data burst control.

As described later in more detail, in a second configuration each of modules 22 includes means for both receiving and transmitting signals, as well as means for sensing the values of various parameters associated with the respective conductor upon which the sensor is mounted. Although other types of communications links may be utilized, the invention is described herein as comprising RF transmitting and receiving means in each of sensors 22 and in a single ground station 29 in control house 28. Transmit and receive antennae of the ground station communication equipment are schematically indicated at 30 and 32, respectively. Corresponding communication equipment of the sensors is shown and described later. All sensors transmit data on a single frequency channel for reception by antenna 32; signals are transmitted by the ground station from antenna 30 on a second frequency channel for reception by the sensor receivers. For example, the system may employ a 950 MHz FM "uplink" (from the ground station to the sensor modules) and a 928 MHz FM "downlink."

Each of modules 22 is equipped to measure the values of voltage, current and phase angle of its associated conductor and may, if desired, be further equipped to measure other parameters such as frequency, conductor temperature, ambient temperature, conductor vibrations, etc.

In the second communication approach described for the sensor modules employing Time Division Multiple Access, measurements of all parameters are made simultaneously by all modules 22 in the system at predetermined times established by a timing signal transmitted from the ground station and received by the modules. The timing signal further establishes "time slots" in which data from each of the modules 22 is transmitted in a predetermined sequence for reception at the ground station.

Sensor module electronics include a microprocessor, RAM, I/O, and timer components, as disclosed in parent application Ser. No. 484,681. The sampled values of the monitored parameters are digitized, stored in RAM, and communicated to the ground station during the established time interval as a burst of signals. The ground station includes a microprocessor to which signals received from modules 22 are supplied for further processing, such as calculation of total circuit and/or substation kilowatts, kilowatt hours, kilovars, etc. The data is then communicated to a central data receiving and control facility by a data link schematically indicated at 34, such as radio, land through the present invention; details of construction and operation appear in the balance of the disclosure.

Figure 2:
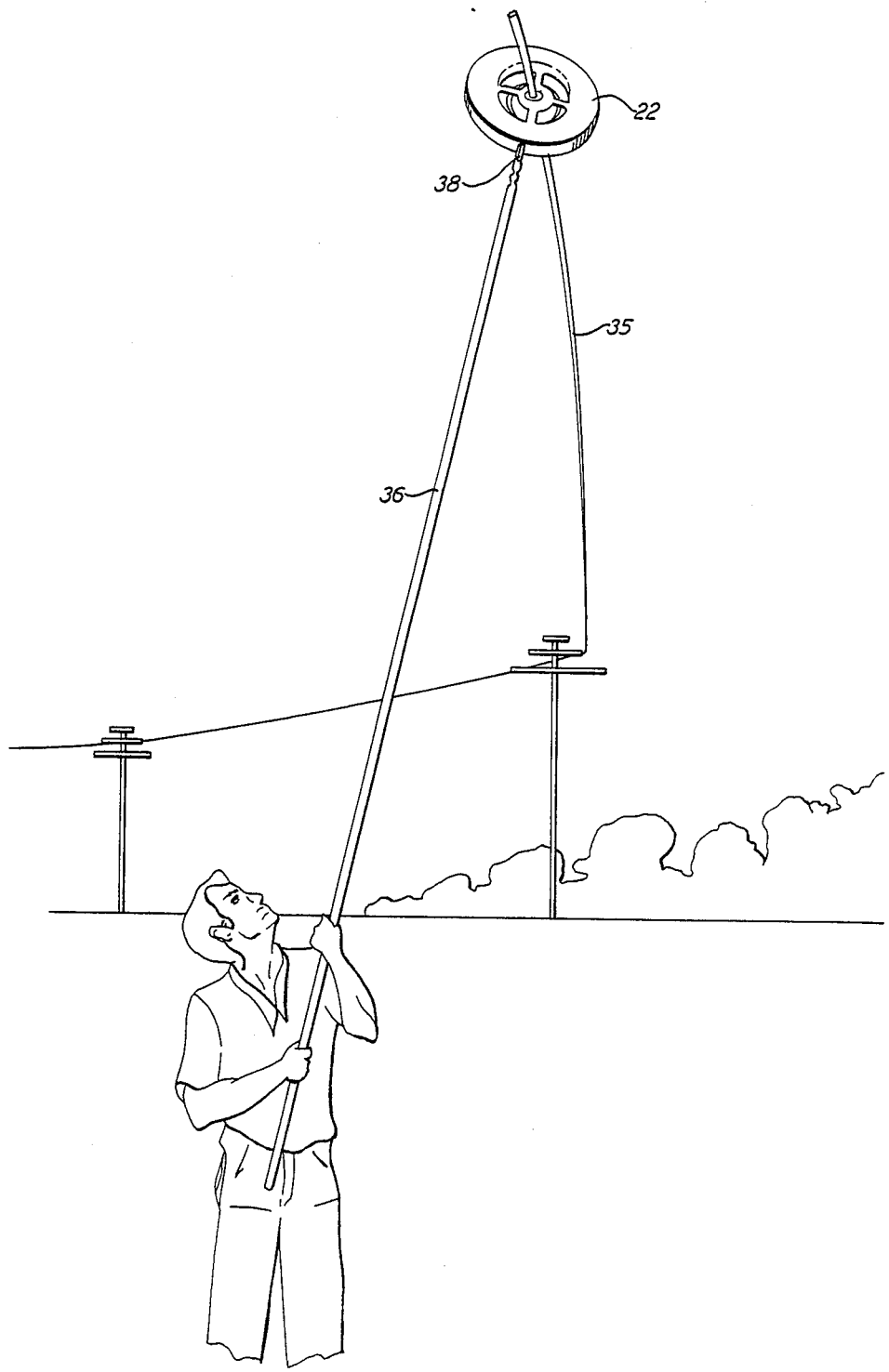
FIG. 2 is a view of a permanent or semi-permanent sensor module embodying the present invention being mounted on a transmission line.

As illustrated in FIG. 2, modules 22 may be mounted upon energized, overhead conductors, such as that indicated at 35, easily and quickly by means of so-called "hot stick" 36 manipulated by an individual on the ground or in a bucket truck. Hot stick 36 includes an attachment tool 38 (to conventional hot-stick 36) which serves in the manner of an Allen wrench to engage portions of module 22 and effect opening and closing movement of two, hinged or pivoted connected sections of the module to permit mounting upon the conductor. One of many possible mechanical embodiments of the mounting means, details of which form no part of the present invention, may be found in parent application Ser. No. 484,681.

Figure 3:
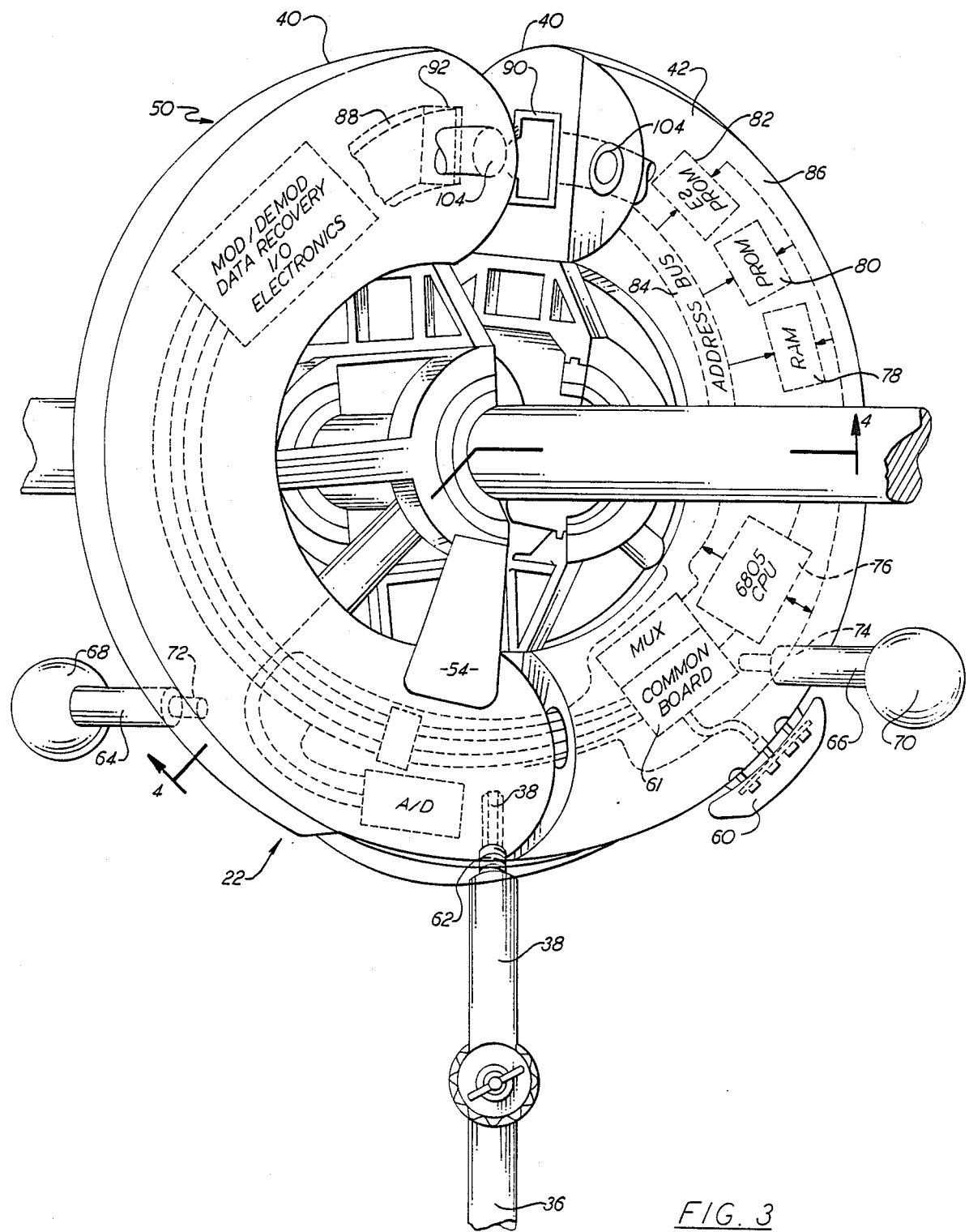
FIG. 3 is an enlarged, perspective view of a sensor module mounted on a conductor.
Figure 4:
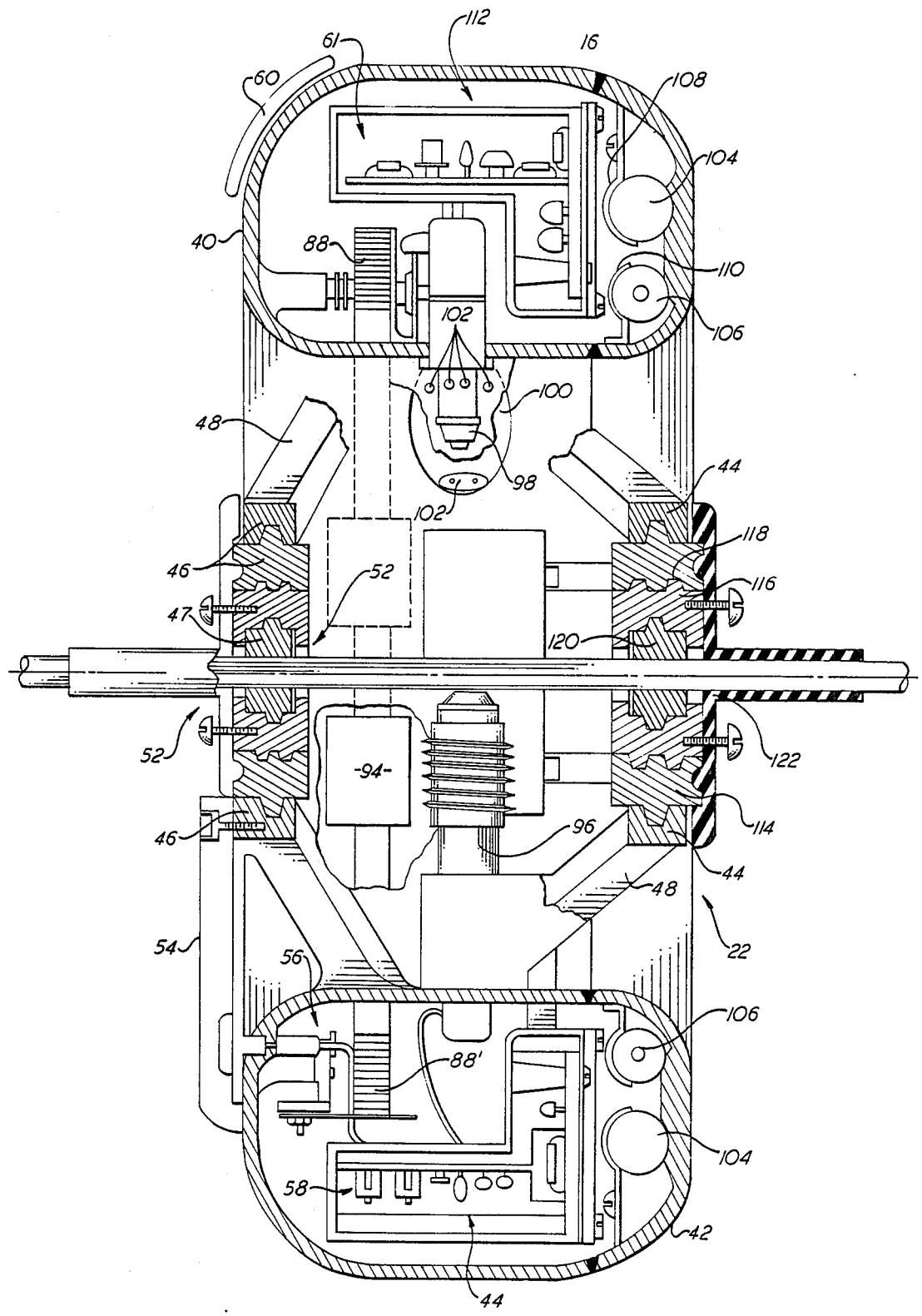
FIG. 4 is a view of the sensor module of FIG. 3 in a cross section through the plane of the conductor.

FIGS. 3 and 4 illustrate the configuration of the sensor module's exterior and interior, respectively. As shown in FIG. 3, the module contains two lower sections 40 and two covers or upper sections 42, held together by bolts (not shown) passing through the covers into threads in the lower casting sections 40. An insulating gasket separates the upper 42 and lower 40 housing sections so as not to form a short circuit loop surrounding the Rogowski coil 88 and the hinged power pick-off core 90 which extend around the torus in the upper and lower sections respectively. Each lower section 40 is provided with a top hub 44 and a bottom hub 46, supported by relatively open spokes 48, FIG. 4. The sensor housing, generally indicated at 50, is secured to a clamping jaws assembly 52 by the open radial spokes 48. The diameter of the internal opening of the assembly dictated by neoprene type hub inserts 47, is variable and is selected for each specific power line conductor size. The assembly diameter can be chosen to accommodate different power cables form 0.5" to 2½" in diameter. An R.F. impedance matching network 54, mounted near assembly 52 is connected via coaxial cable parts 56 to a shielded transmitter and electronics shown generally at 58 inside module 22. Similar connections are made between the receiving antenna 60, if used, and communications board 61 inside module 22 for the alternative embodiment employing the time synchronized TDMA communications technique. Also shown in FIG. 3 is a fragment of hot-stick tool 36 with Allen wrench portion 38 extending into hole 62 in module 22. The hot-stick is turned in one direction to cause the hinged/pivoted sections of the module to open so that it can be placed over a conductor. Turning the hot-stick in the opposite direction causes the module to close over the conductor and clamp onto it tightly. The tool 36 can then be removed by simply pulling it away. Reinsertion and turning in the opposite direction will open the module and allow it to be removed from the transmission line. This placement/removal feature provides great flexibility in locating the modules in the transmission system.

Further illustrated in FIG. 3 are metallized plastic, tubular rods 64 and 66 which extend from sensor housing 50 and which terminate in metallized plastic spheres 68 and 70, respectively. The tubes and spheres are drawn at reduced scale for illustrative purposes. The tubular rods 64 and 66 are attached to the cast aluminum sensor housing 50 by threaded inserts 72 and 74, respectively. The tubular rods 64 and 66 with spheres 68 and 70 provide an increase in the effective surface area of the toroidal shaped sensor housing 50 which enhances the electrostatic charging capacity of the present invention. Solar photovolaic cells embedded on the surface of the tubular rods and spheres can also be used, if required, to further augment the charging energy when line current is below the threshold for electromagnetic powering of the circuitry. An electrical connection between surface areas is ensured by direct contact between the metallized rods 64 and 66 and the metal sensor housing 50. In addition to the previously described elements, module 22 is equipped with CPU processor board 76, RAM 78, PROM board 80 and optionally, electronically eraseable E2-PROM board 82. For maximum packing density, multi-tiered circuit boards are used inside shielded compartments. Care is taken to avoid any 60 Hz short circuit loops. Address bus 84 and data bus 86 interconnect the circuit cards.

Power to operate the sensor module electronics is normally derived from windings on a laminated iron core which surrounds the conductor. The core is excited by the power line conductor current forming the single turn primary and the power supply windings 134 form the secondary coils of the power supply transformer. The core and winding are shown diagramatically in later Figures, and are divided into two sections for mounting in the two hinged/pivoted connected sections of the toroidal housing. Fragments of the upper portions of the two sections of the iron core, both indicated by reference numeral 88, are shown in the broken-away portions at the bottom of the housing. When module 22 is mounted on the conductor, the pole faces of the two sections of core 88 must close with a minimum controlled air gap and protected against corrosion. For this purpose, moisture-proof recess 90 is provided around one pole face, and plastic shroud 92 surrounds and extends outwardly from the other pole face for mating engagement with recess 90 in the closed position of the module.

Module 22 is shown in cross section in FIG. 4. Temperature probes, such as that indicated at 96, extend from contacting relation with the conductor to electrical connections within housing 50 in order to generate signals commensurate with the temperature of the conductor. Similarly, ambient air temperature in the vicinity of the conductor is measured by probe 98, enclosed in a white shroud 100 which protects the probe from both direct solar exposure and heat generated by the conductor. Openings 102 permit air to flow freely over probe 98 and also ensure drainage of condensation. Both probes 96 and 98 are thermally insulated from housing 50 to prevent the latter from effecting the sensed values.

Current flow through the conductor is measured by Rogowski coil 104, which extends around the interior of housing 50 in side-by-side relation with an array of rechargeable batteries 106. Coil 104 and batteries 106 are held in place within sections 42 of the housing by hold-down clamps 108 and 110, respectively. Elements of the data sensing, receiving and transmitting electronics are indicated generally by reference numeral 112 within housing 50. The hub assembly includes outer ring 114, inner ring 116 insulated therefrom by oxide film layer 118, conductive rubber insert 120 selected in accordance with the diameter of the conductor, and optional synthetic rubber end hub caps 122 providing a moisture seal at each end of the hub where environmental conditions require. Alternatively, the insulated oxide film junction may be provided between the hub 44 and ring 114.

Figure 5:
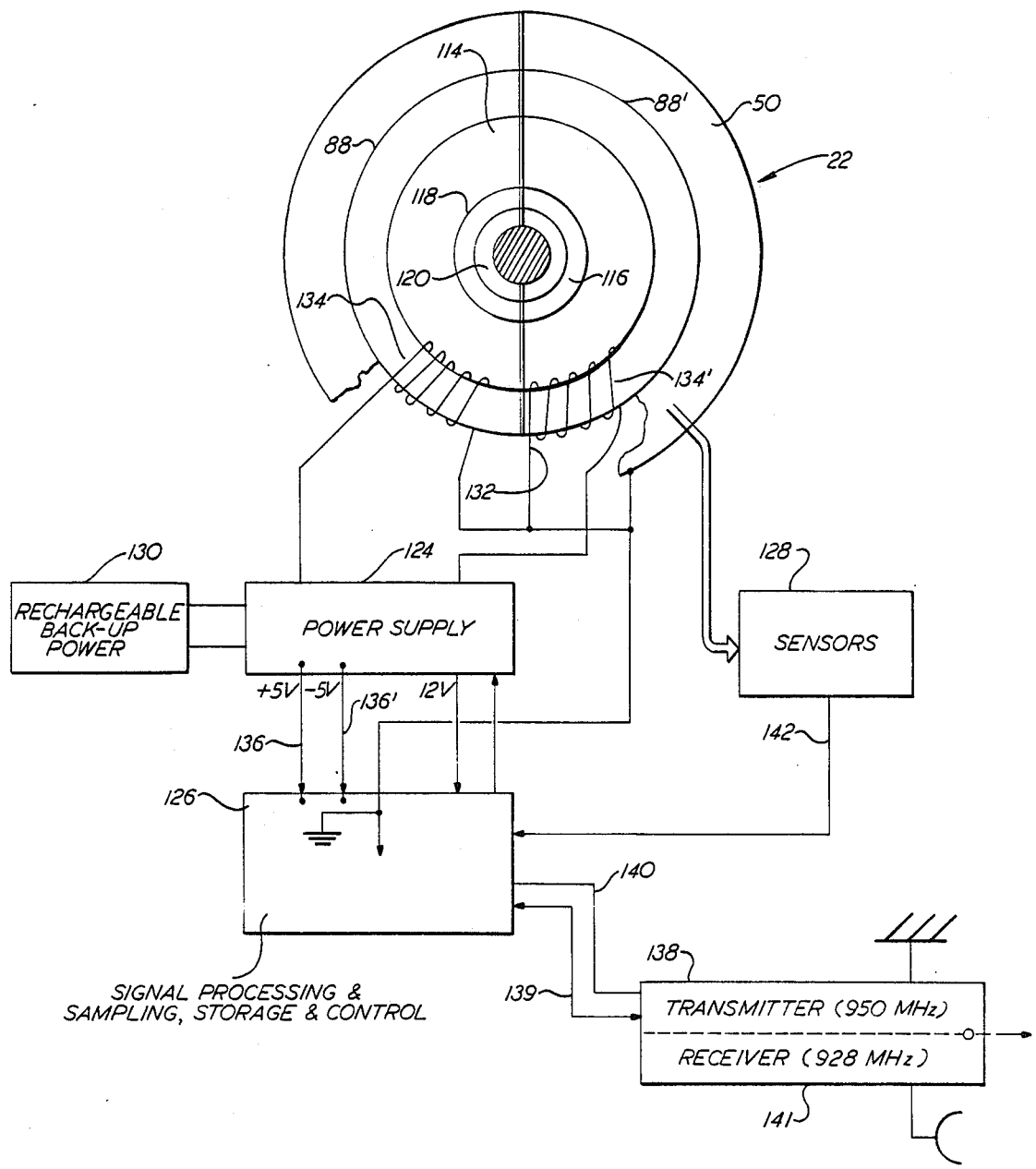
FIG. 5 is a general block diagram of the sensor module electronics.

The sensor module electronics are shown in their overall configuration in FIG. 5. They comprise a power supply 124, signal processing, sampling, storage and control electronics 126, the various parameter sensors indicated by box 128, back-up energy storage and electrostatic and/electromagnetic charging electronics 130.

The center tap 132 of the power pick-off coils 134 and 134', surrounding core sections 88 and 88', respectively, is connected to metallic housing 50 of sensor module 22, which in turn is connected through a capacitor provided by insulated outer and inner hub rings 114 and 116 to the power conductor via the conducting insert 120. The regulated power supply 124 provides regulated ±5 volts to the electronics 126 via lead 136, 136' and an additional, switched 12 volts for transmitter and receiver 138 via lead 140. Electronics 126 provides a transmitter control signal on line 139 to control the power supply to the transmitter, as well as receiver 141 in systems wherein the sensor modules also include a receiver, as described later. Sensors 128 provide analog signals on lines indicated at 142 to electronics 126.

Figure 6:
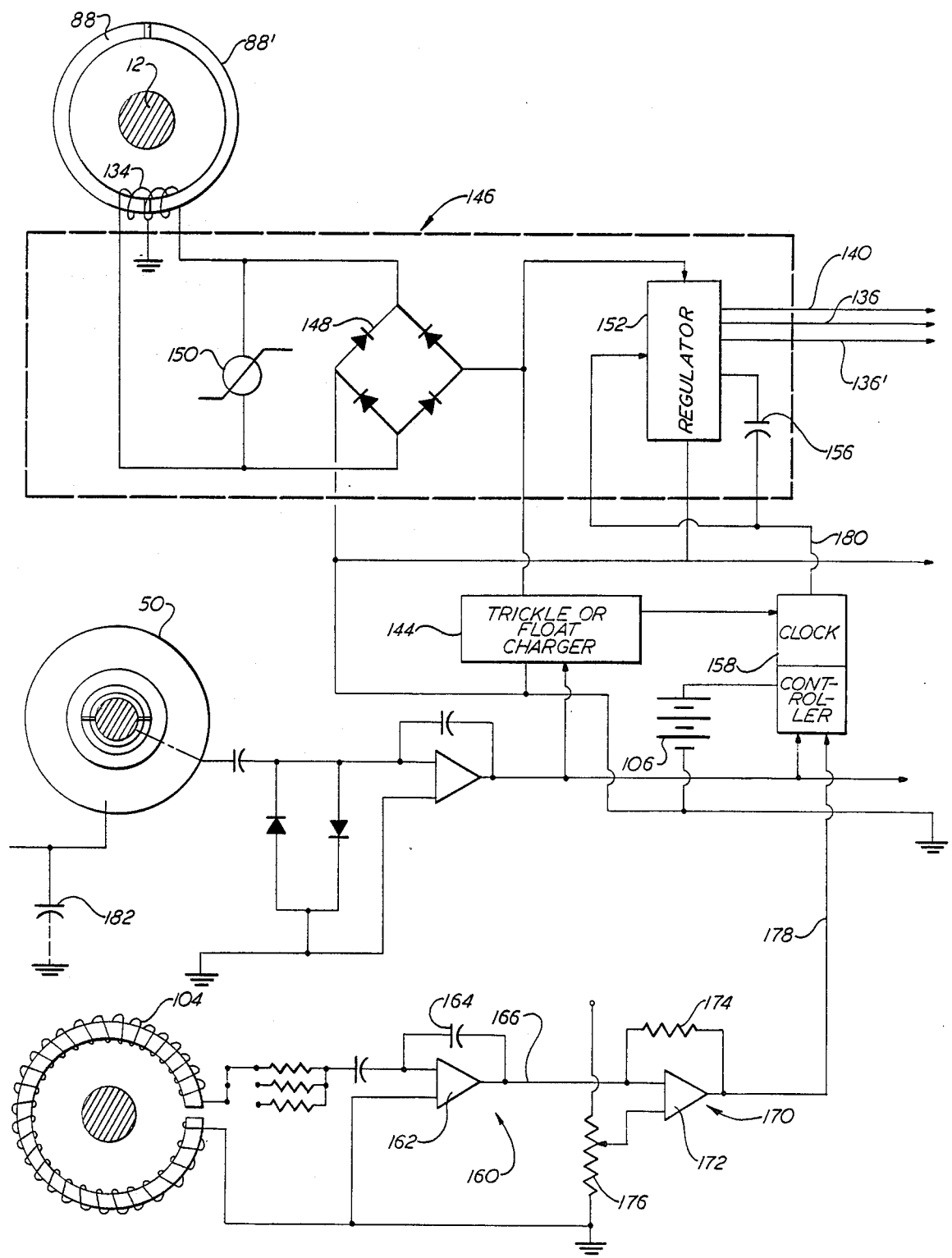
FIG. 6 is a schematic diagram illustrating the power supply and rechargeable power back-up system of the present invention.

The schematic electrical circuit diagram of the power supply 124 and back up energy storage 130 is shown in FIG. 6. The power back up system includes a rechargeable energy source such as previously mentioned batteries 106, voltage and current monitoring circuitry provided as previously described, and battery float charging circuitry 144. Without the apparatus of the present invention, measurement of transmission line parameters was not possible below a line current threshold of approximately 15 amperes. Below this threshold level, the inductive power from line current is insufficient to operate the sensor module electronics and transmitter unless the power core cross-sectional area were significantly increased and therefore made much too heavy for hot-stick installation on live transmission lines. Power supply 146 is shown with its major functional elements. During typical operation, i.e. with line current above the minimum threshold value, power is derived through electromagnetic induction using the magnetic field generated as a result of current flowing through conductor 12. The hinged iron core 88, with power pick-off coils 134 providing the secondary, and the line conductor forming the single turn primary of a power transformer, supplies all internal power to the sensor module. Winding 134 is connected to bridge rectifier 148 to provide unregulated DC power. Protection against power surges is provided by a GEMOV device 150. The output of rectifier 148 is supplied to DC regulator 152 which supplies the DC voltages required by sensor module electronics on lines 136, 136' and 140. Capacitor 156 is connected between the regulator and the controller/clock circuitry 158.

As previously described, current in the conductor is measured by Rogowski coil 104. Current threshold sensor 170, comprising operational amplifier 172 and resistor 176 is fed current I on line 166 from the Rogowski coil. The measured current threshold reference is set through resistor 176, and is determined by the requirements of the sensor module, e.g. 15 amperes. Current I on line 166 is supplied to threshold comparator/detector 170 comprising amplifier 172 and resistor 174 which will detect current values above the threshold value as supplied through resistor 176. Comparator/detector 170 provides an above/below threshold indicating signal on line 178 to the controller/clock 158.

Above the threshold current value, power is supplied by electromagnetic induction through power supply 146. Below the threshold value, power is supplied to the sensor module by rechargeable batteries 106. The status of the conductor current (i.e. above/below threshold) is supplied to battery controller/clock circuitry 158 by comparator/detector 170 on line 178. When the below-threshold condition is sensed, the controller 158 will enable DC power from battery 106 to be supplied to regulator 152 on line 180. The DC voltage levels required by the module electronics are thereby provided by the battery. When the conductor current reaches the threshold level, controller 158 will allow float charging of battery 106 and sensor module power is once again supplied directly by power supply 146. For periods of operation at zero current, with line voltage present, exceeding a preset (through PROM) duration the frequency of the transmission bursts is reduced to conserve battery energy. If, during sustained periods of zero current on the conductor, the battery voltage falls below a predetermined safe value controller 158 will discontinue power supplied by battery 106 and prevent any additional drain. Further zero current operation will be possible only after the line current exceeds the threshold setting and the battery is float or trickle charged.

Figure 7:
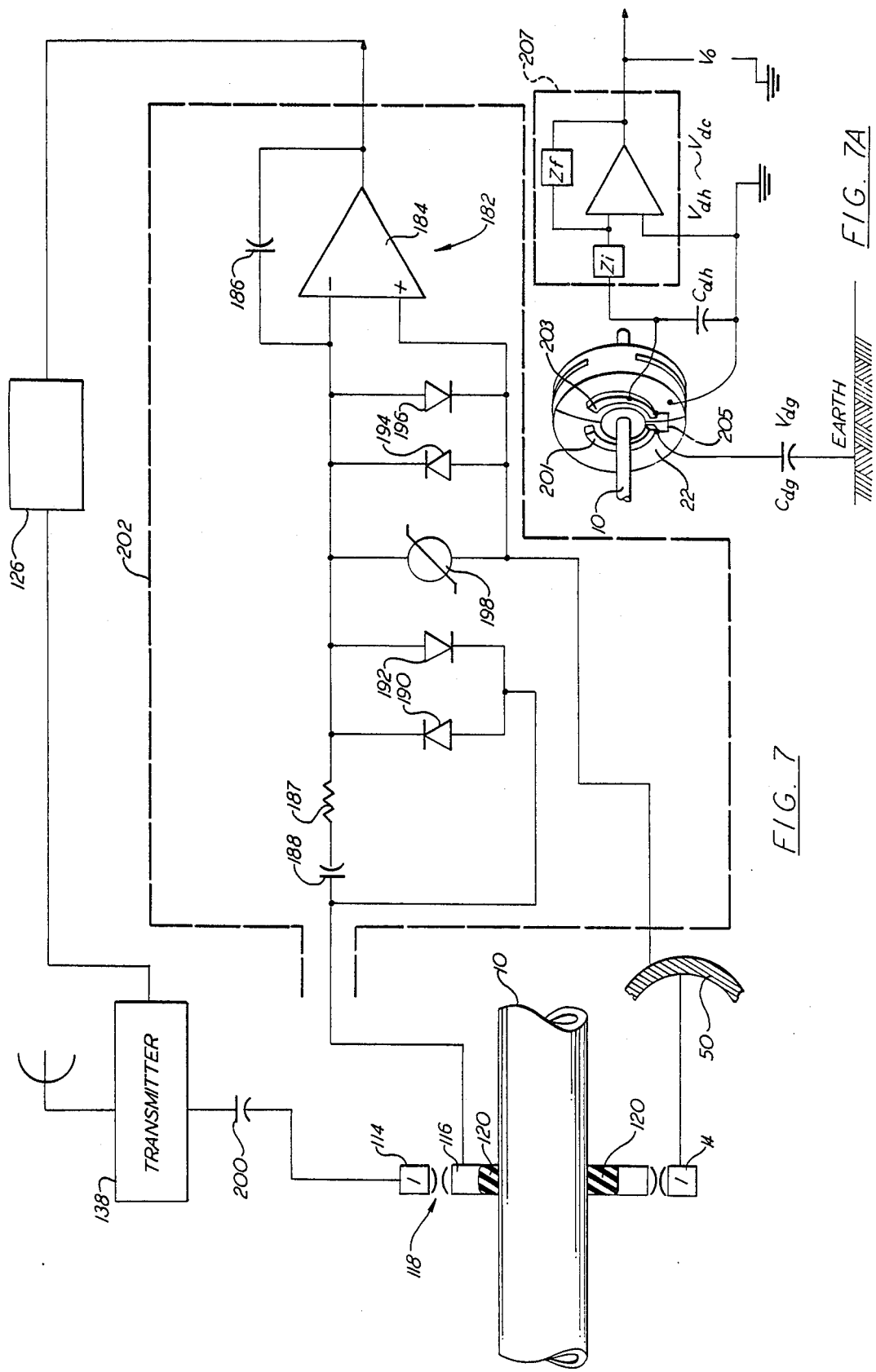
FIG. 7 is a schematic diagram of the voltage sensing means of the invention.

The means of the present invention for measuring the voltage on the conductor is illustrated in FIG. 7. Included in such means are insulation of the housing from the conductor, for example, the hub elements of the module, i.e., metal outer and inner rings 114 and 116, respectively, may be electrically insulated from one another by oxide film layer 118, indicated in FIG. 7 as a capacitor, and conductive, resilient insert 120, all previously described in connection with FIG. 4. An integrator, indicated generally at 182, consisting of operational amplifier 184 and gain control feedback capacitor 186, has one input connected through resistor 187 and capacitor 188 to inner ring 116, and the other to the outer skin of housing 50 of module 22. The low input impedance of operational amplifier 184 causes the charging current to flow from the high voltage conductor 10, through capacitor 188 and resistor 187, to the input of operational amplifier 184. The low impedance and high gain of amplifier 184 insures that the potential of housing 50 is essentially the same as that of conductor 10, i.e., the potential between housing 50 and ground is the potential between ground and conductor 10. The insulating layer provided by metal oxide 118, causes the charging current to flow through amplifier 184 rather than directly to housing 50. Therefore, operational amplifier 184 will provide an AC output voltage exactly proportional to the current through the skin of sensor module 22 to ground, which is directly proportional to the high voltage between conductor 10 and ground. The dimensions and material of the insulating layer 118 between inner and outer rings 114 and 116 are selected to provide a capacitance value which would allow the charging current of the highest frequency voltage component to be measured to pass through to operational amplifier 184.

Capacitor 188 is relatively large, e.g., 5–10 MFd, to block any DC signals. Resistor 187 is a current-limiting means to protect against fast rise-time surges. Diodes 190 and 192 clamp the voltage across resistance-capacitance 187–188; similarly, diodes 194 and 196 clamp the voltage across the inputs of amplifier 184. Metal oxide surge suppressor 198 protects the circuit components against damage due to momentary transients. The output signal representing the voltage value is coupled, through electronics 126 (FIG. 5) to transmitter 138. The latter is coupled through RF shunting capacitor 200, to outer ring 114 which is connected directly to housing 50 and through capacitor formed at 118 to the conductor 10 at the RF transmission frequency of 928 MHz. The components of the voltage measuring systems indicated in FIG. 7 are mounted within shielded (metal) enclosure 202 within housing 50.

An alternate means for measuring voltage on conductor 10, disclosed in parent application Ser. No. 484,681, is illustrated in FIG. 7A. Arcuate, electrically conducting plates or discs 201 and 203 are attached to the exterior of the metallic housing of module 22 with a thin layer of insulation between each plate and the housing surface, thereby providing a capacitance at each plate. In the drawing, $C_{dg}$ and $V_{dg}$ represent the capacitance and voltage, respectively, between discs 201 and 203, which are connected by lead 205, and earth. $C_{dh}$ represents the capacitance between the discs and the module housing, which is electrically connected to and thus at the potential of conductor 10. High impedance amplifier 207 measures the voltage between the discs and housing ($V_{dh}$), which is proportional to the voltage between the discs and earth $V_{dc}$, since the circuit is configured as a voltage divider. The input and feedback impedance of the amplifier are represented by Z; and $Z_f$, respectively. The measured voltage $V_o$ between the output of high impedance amplifier 207 and ground potential is proportional to the voltage across the discs and housing $V_{dh}$. This means of voltage measurement does not provide the level of accuracy of the FIG. 7 system, but is less expensive and may be acceptable for some applications.

From the foregoing, it is apparent that the invention provides a sensor module, adapted for hot-stick mounting on an energized power conductor, capable of measuring voltage as well as current on the power conductor (and other parameters, when desired). By providing current and voltage zero-crossing detection, the phase angles and frequency may also be determined, thereby permitting quantities such as watts and watt-hours, etc. (in any desired combination of parameters) to be derived. The module electronics may be operated by power taken directly from the conductor upon which the module is mounted or, when current on an energized conductor falls below a predetermined threshold value (including zero current conditions), by back-up power means independent of the conductor. The parameter values are transmitted from the modules to a ground station and systems which may be employed for transmitting signals in a time-synchronized manner from modules sensing the parameters on each phase of a three phase circuit, or from all circuits of an entire substation will now be described.

Figure 8:
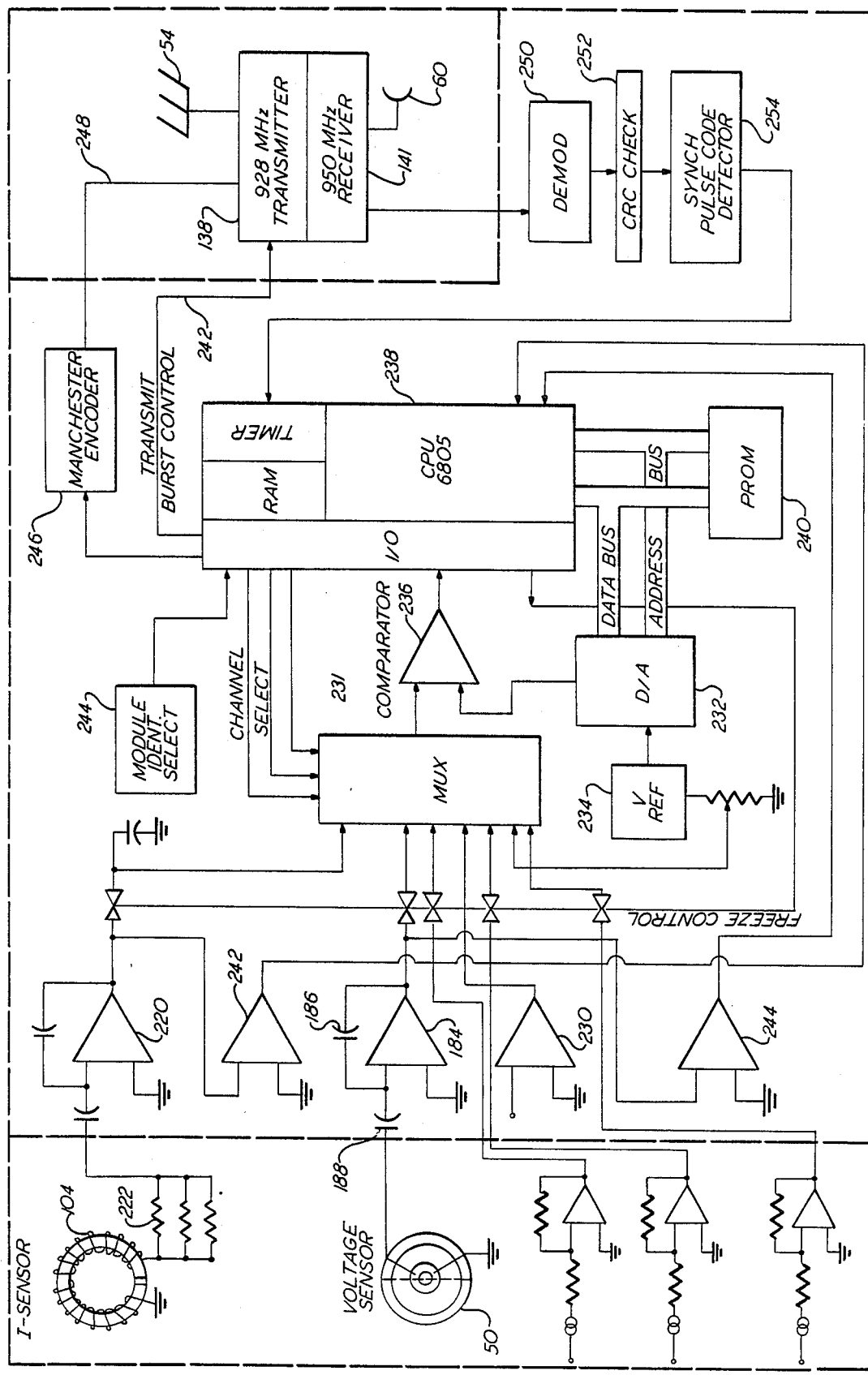
FIG. 8 is a detailed block diagram of portions of the module shown generally in FIG. 5.

Referring now to FIG. 8, current and voltage on the conductor at a predetermined point in time are sensed simultaneously by Rogowski coil 104 and housing 50, respectively, in the manner previously described. Rogowski coil 104 is connected to input amplifier 220 through current range select resistors 222. The voltage sensor is connected through capacitor 188 to low impedance operational amplifier 184 with feedback capacitor 186, as previously described, to provide an output signal in phase with the line-to-neutral voltage. A novel means for improving the accuracy of voltage readings by compensating for the effects of adjacent, energized conductors is described in application Ser. No. 859,497 of the present inventor, filed of even date herewith.

Additional amplifiers such as that indicated at 230 are provided for measurement of additional parameters, such as conductor temperature, ambient temperature, conductor vibrations, etc. The output of each of the parameter-measuring amplifiers is connected through multiplexer 231 for comparison with the output of digital/analog converter means 232, which receives an input from voltage reference 234, at comparator 236, under the control of digital computer 238. The latter may be, for example, a Motorola CMOS 6805 microprocessor having I/O, RAM and timer components. Programmable read only memory 240 is connected to the computer CPU for storing the program. Current and voltage zero crossing detection is provided by amplifiers 242 and 244, respectively, each having one input connected to the output of the respective current and voltage measuring amplifiers, and the other input connected to ground. The outputs of both zero crossing detectors are connected directly to microprocessor 238 for phase measurement.

Figure 9:
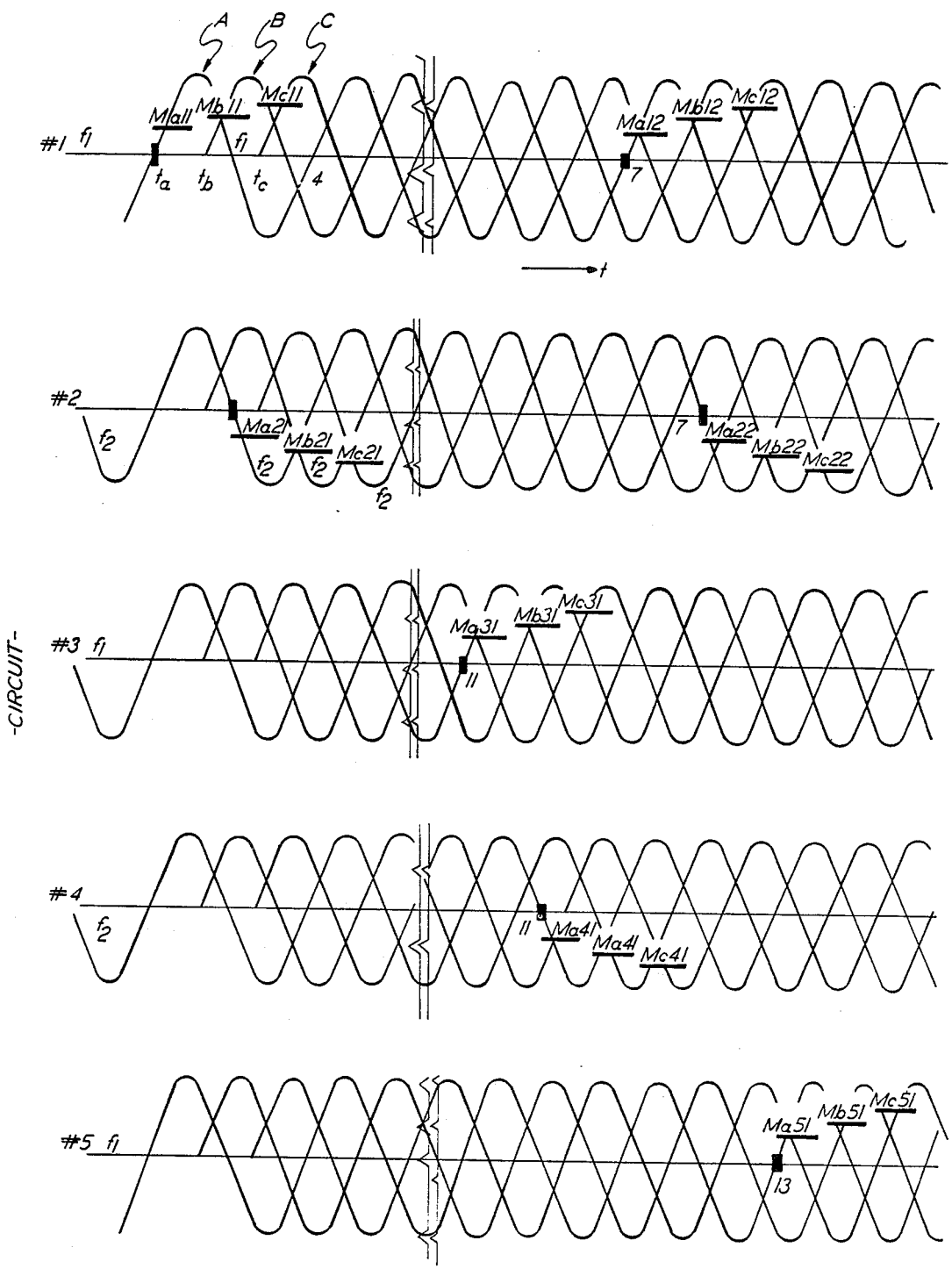
FIG. 9 is a graphical depiction of the voltage waveforms of the three cycles of each of a plurality of circuits connected to a substation bus.

In addition to providing the signals necessary for measurement of phase angle and frequency (which is the inverse of the time between successive positive going zero crossings) the signals from voltage zero crossing detector 244 may be used for synchronization of data transmissions by transmitter 138 without requiring a receiver in the sensor module and a transmitter at the ground station. Referring to FIG. 9, the voltages on each phase of a total of five 3 phase circuits are indicated with respect to time. Transmissions from each of the three individual sensor modules of circuit 1 (one mounted on the conductor of each phase) are made, for example, within 4.5 millisecond (or less) bursts $M_{a11}$, $M_{b11}$, $M_{c11}$ following each positive-going zero-crossing of the voltage on the associated conductor at a first selected frequency $f_1$. That is, a coded message in the form of a burst of signals indicative of the parameters measured at that time may be transmitted by the transmitter of the module on phase A during time interval $M_{a11}$; the messages from the modules mounted on the conductors of phases B and C are transmitted during times $M_{a11}$ and $M_{c11}$, respectively. This approach takes advantage of the fact that zero crossings of adjacent phases of a 3-phase circuit are speaced $wt = 120°$ apart. Thus, a complete data transmission from all three phases is completed within one full cycle. By transmitting the messages in a time span less than that between zero crossings of successive phases there will never be a problem with overlapping or interfering transmissions from more than one module at a time. Messages may be transmitted, for example, every seventh cycle, leaving ample time for data collection and processing between transmissions. The transmit burst control signals are communicated from microprocessor 238 to transmitter 138 via line 242.

When there are several circuits connected to a given bus at a substation, transmissions may be synchronized to prevent overlap by proper spacing of transmissions and/or selection of broadcast frequencies. For example, transmissions from the modules of circuit 2 may be initiated by the negative-going zero crossings on a second frequency, thus permitting transmissions overlapped in time with those from the modules of circuit 1. The first message from phase A of circuit 2 is transmitted during time $M_{a21}$, and those from phases B and C during times $M_{b21}$ and $M_{c21}$, respectively. Transmissions may be made on the first frequency from other circuits during the periods when the modules of circuit 1 are not transmitting. Circuit 3, for example, may transmit on the first frequency at times $M_{a31}$, $M_{b31}$ and $M_{c31}$ every eleventh cycle. The second messages from the circuit 1 modules are transmitted at times $M_{a12}$, $M_{b12}$ and $M_{c12}$, after the seventh cycle.

If transmissions from the three modules of each circuit are completed within one full cycle (as would be the case for successive 4.5 millisecond transmissions, since a full cycle takes 16.7 milliseconds at 60 Hz) then transmission from each circuit would be spaced by a number of cycles at least equal to the number of circuits. However, in order to insure that transmissions do not overlap after temporary circuit interruptions, which may occur at random, different numbers of cycle spacings between transmissions should be chosen for the circuits and no two numbers may have a common denominator. For example, transmissions from 5 circuits on a single frequency could be spaced by 7,11,13,17 and 19 cycles respectively. Thus, if it is important to receive data from each circuit with a high repitition rate, the number of broadcast frequencies would be increased; on the other hand, if economy of frequency spectrum is more critical, transmissions would be spaced more widely. It should be noted, however, that as many as 10 circuits (30 modules) could transmit on a single frequency with the data being updated every second. This approach does not require Receiving antenna 60, Receiver module 141, demodulator 250, CRC check module 252 and synchronization pulse code detector 254. These modules are deleted for this mode of communication to the ground station.

Referring again to FIG. 8, a transceiver system is shown which permits time synchronized, sequential data transmission from a relatively large number of modules, e.g., all modules necessary for monitoring an entire substation such as that of FIG. 1, to a single ground station on a single broadcast frequency. The zero crossing detectors previously described for controlling the timing of transmissions from the three modules of one circuit may also be used to provide basic synchronization with TDMA coded timing signals transmitted from the ground station and received at the module by receiver 141. Each module is assigned an identifying number which is selected initially through module 244. The digitized data representing the parameter values is assembled into appropriate messages, encoded in Manchester code by encoder 246 and supplied to transmitter 138 via line 248 for transmission in assigned time slots designated by TDMA data burst control signals received by receiver 141. The timing signals from the ground station are passed on from receiver 141 to demodulator 250 (which can be part of the receiver 141). The demodulated TDMA signal contains information on the assigned time slot for transmission by the particular sensor module. The signal is passed through CRC check module 252, for error detection and the pulse code is detected by module 254, providing the microprocessor with information to control the transmitter burst timing.

A block diagram of the ground station electronics used at a substation to receive transmissions from all sensor modules which perform the monitoring function, and processing the signals received from such modules, is shown in FIG. 10. A more, detailed description is found in the copending application Ser. No. 859,497. When sensor modules 22 include self-contained control of transmission timing, the ground station requires only receiver means (i.e., the modules require no receiver and the ground station requires no transmitter). If, on the other hand, timing of transmissions by the respective modules is controlled to take place in assigned time slots, in the manner previously mentioned, a transmitter is provided at the ground station and a receiver in each module. In either case, the Manchester coded signals transmitted by the individual sensor modules are received through antenna 32 at receiver 256, passed through serial port 258 of the communication board and CRC error check module 260 to CPU 262 through the data bus. An I/O interface is provided for receiving external signals for implementing the functions of a conventional remote terminal substation unit, as indicated by the labeled blocks connected to CPU 262. Keyboard interface 264 is connected to CPU 262 for local control of parameters to be displayed on a single line alpha numeric display device 266. CPU 262 is also provided with an RS 232 port 268 for loading and unloading personality tables, or for a man-machine interface using a portable microcomputer, such as an IBM-XT or a COMPAQ. CPU 262 is provided in the usual manner with RAM 270, PROM 272 and Electronically Eraseable PROM 274, the latter being used to display the scale factors and personality tables for the sensor modules through RS 232 interface 268. The micro-code for claculating the various output parametrers is stored in PROM 272.

In addition to the data received from sensor modules 22, the combined remote terminal unit is equipped to receive direct, hard-wired inputs from conditioned, conventional current and potential transformers 276 and 278, respectively. Analog signals proportional to the input current and voltage are fed to conditioning amplifiers 280, sample-and-hold circuitry 282 and thence to multiplexer 284 in a manner similar to the processing of analog signals in the sensor modules, as previously described. A/D converter 286 and analog metering control board 288 transfer the digitized signals to CPU 262 where the data is processed in a manner similar to the sensor module data.

The foregoing description of ground station electronics is amplified to some extent in previously mentioned copending application Ser. No. 859,487 and includes all elements required for receiving and processing signals transmitted by the various sensor modules. When timing of such transmissions is to be controlled by coded signals indicating assigned time slots to each module, the ground station further includes time division multiple access (TDMA) message synchronization signals from CPU 262, and connected through pulse code modulator 292 to transmitter 294. The signals assigning transmission times to the various modules are then transmitted from the ground station via antenna 30 and received at the modules by receiving antenna 60 provided for such purpose.

Figure 11A:
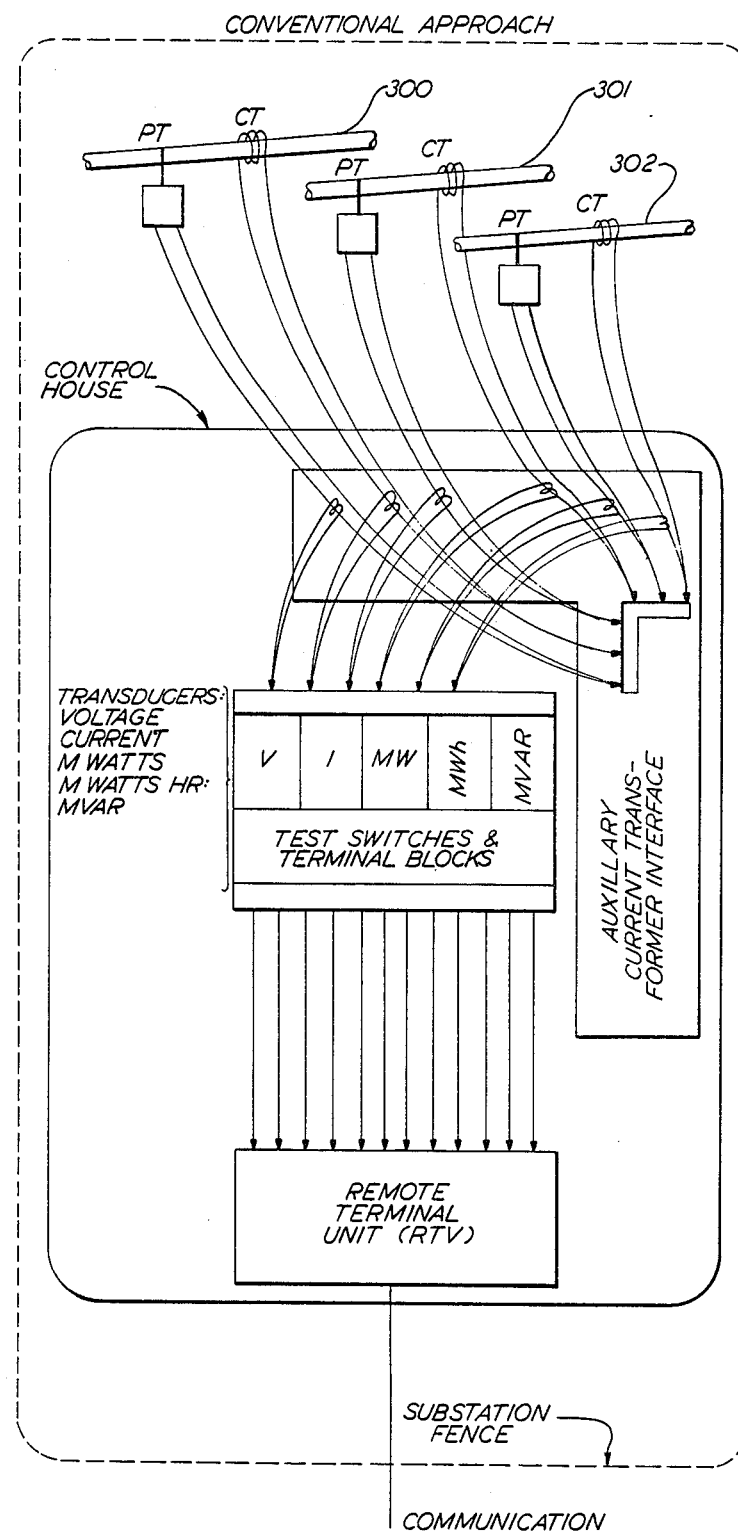
FIGS. 11A and 11B provide a diagrammatic comparison of the monitoring systems of the prior art and the present invention.
Figure 11B:
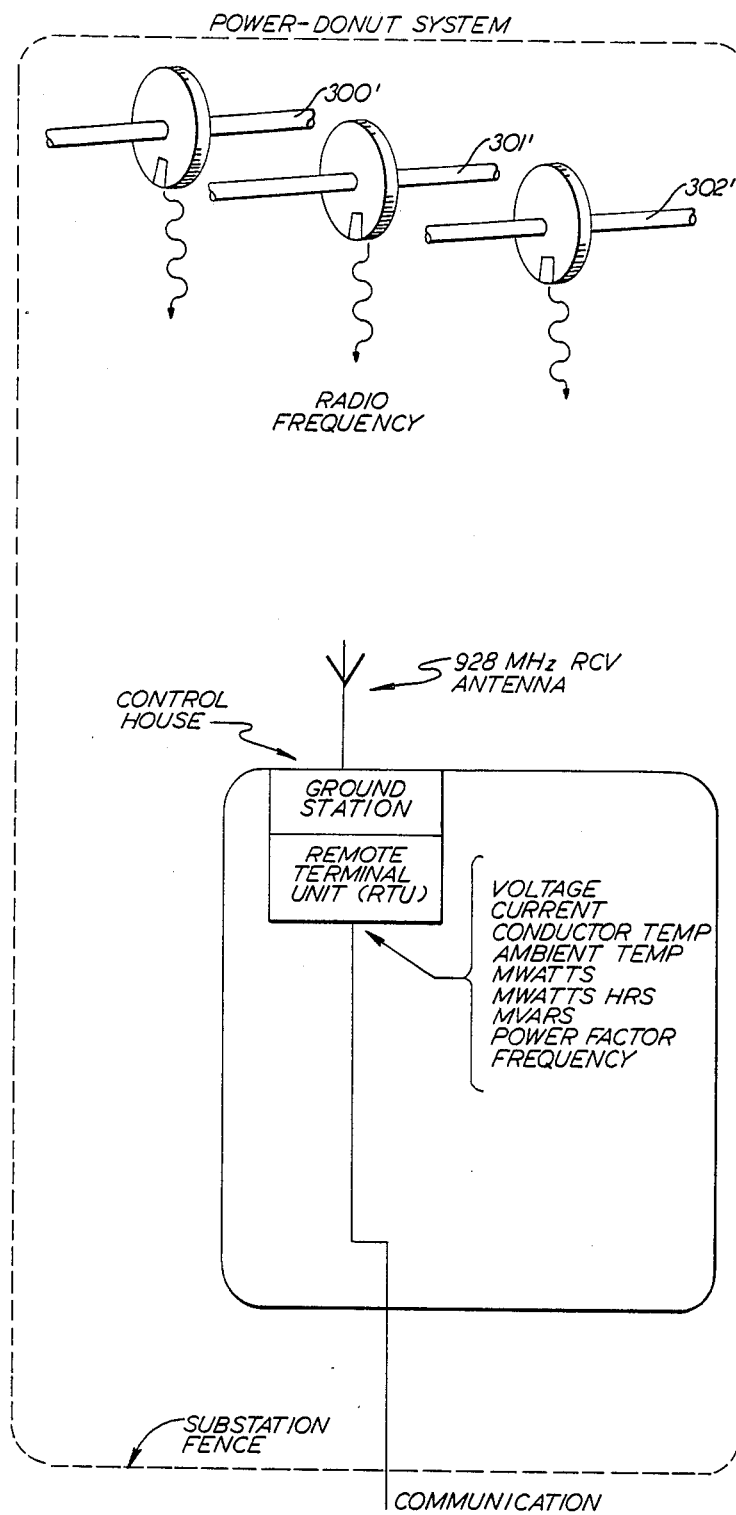

A direct comparison between substation monitoring as conventionally performed by hard-wired current and potential transformers, and by the approach of the present invention is provided by FIGS. 11A and 11B. The conductors of each phase of a single circuit are indicated in FIG. 11A by reference numerals 300, 301 and 302, and in FIG. 11B by numerals 300', 301', and 302', it being understood that the number of circuits and conductors would be dependent on the size of the station. Under prior technology it has been necessary to deenergize the circuits to install new current and potential transformers for an overhead line. Such transformers require massive and costly porcelain bushings, support structures and concrete foundations. These primary transformers, located in the substation yard, must then be connected to auxiliary transformers in a control house, which in turn are connected through test switches to discrete transducers for each quantity to be measured. Transducers so labeled in FIG 11A are connected through terminal blocks to a separate, remote terminal unit (RTU) also so labeled.

According to the teachings of the present invention, sensor modules 22 are mounted upon each phase of the circuit and measure current, voltage and phase angle in the manner described. The modules may be mounted directly upon energized conductors, without interruption of power. Sequential transmission of data bursts from all modules at the substation is controlled by either of the two disclosed methods, i.e., by synchronization with voltage zero crossings and bursting data to the ground station after a pre-selected number of cycles have elapsed for each module, or by providing a ground transmitter and a receiver in each module for coded time-synchronization signals. Signals indicating the sensed parameters on each phase of all circuits at the substation are received and processed at a single remote terminal interface and the same microprocessor is used to perform conventional alarm, status, sequence-of-events, select-before-operate, other analog monitoring, and pulse accumulator functions of a conventional Remote Terminal Unit, i.e., the ground station acts as a combined Remote Terminal Unit (CRTU).

It is thus apparent that the present invention provides a complete monitoring system which is superior in performance and flexibility to conventional systems while, at the same time, being vastly smaller, lighter, less costly and more convenient to install, remove, repair, etc. The comparison is more dramatic when it is noted that all of the bulky and expensive equipment indicated in FIG. 11A must be duplicated in its entirety for every circuit monitored at a substation, while only the sensor modules are duplicated (one for each conductor) in FIG. 11B regardless of the number of circuits. That is, only one CRTU, having a size essentially the same as that of the RTU of the conventional system, is required in the present system, thereby totally eliminating all the measurement transformers, test switches, transducers, terminal blocks, hard wiring and supporting structures required for every circuit in conventional systems. By way of comparison, a sensor module could have a weight of less than 20 pounds, while the corresponding prior art equipment would weigh several thousand pounds.

What is claimed is:

1. A system for monitoring a plurality of parameters associated with each of a plurality of energized electrical power conductors, one of said parameters being conductor voltage, on power system circuits operable over a load range between predetermined minimum and maximum conductor currents in either direction for complete installation and removal while said conductors are energized, said system comprising:
    (a) a plurality of sensor modules each having a metallic housing, one of said modules being mounted upon each of said energized conductors, said housing being conductively isolated from said conductor at least for frequencies below the highest frequency of conductor voltage to be measured, whereby the surface of said housing continuously collects the charging current due to the electrostatic field associated with said conductor;
    (b) means connected between said conductor and said housing for measurement of conductor voltage from said charging current;
    (c) means contained within said housing for continuously sensing the current through said conductor over said entire loan range;
    (d) means carried by each of said modules for establishing the phase relationship between said sensed values of conductor voltage and conductor current;
    (e) means carried by each of said modules for identifying, processing and storing said sensed values of conductor voltage and conductor current and said established phase relationship;
    (f) means carried by each of said modules for transmitting a sequence of encoded signals commensurate with each of said sensed values and including said established phase relationship and sensor module identification; and
    (g) means remote from said modules for receiving said signals from each of said plurality of sensor modules, decoding said signals and calculating voltage, current and power factor of each of said conductors.

2. The invention according to claim 1 wherein said remote means includes means for calculating power and energy quantities from said readings of voltage, current and phase over said entire load range.

3. The invention according to claim 1 and further including means for measuring the frequency of voltage and current on said conductors.

4. The invention according to claim 1 and further including means for sensing parameters other than voltage, current and phase.

5. The invention according to claim 1 wherein said conductor voltage and current contain harmonic and transient components and said remote means includes means for calculating the harmonic and transient components of voltage, current and power.

6. The invention according to claim 1 wherein said housing is conductively isolated from said conductor by a relatively thin layer of insulation interposed therebetween.

7. The invention according to claim 1 wherein said housing is conductively isolated from said conductor by a capacitance having a value providing a relatively high impedance at said frequencies below the highest frequency of conductor voltage to be measured and appearing as a short circuit between said housing and conductor above said highest frequency, thereby permitting said charging current to flow through said conductor voltage measurement means at said frequencies below the highest frequency of conductor voltage to be measured.

8. The invention according to claim 1 wherein said means for establishing phase relationship include means for detecting zero-crossings of conductor current and voltage, and said data transmitting means includes means to transmit a message of predetermined duration in synchronization with said voltage zero crossings.

9. The invention according to claim 1 and further including energy storage means carried by said sensor modules for powering said transmitting means when current flow through the associated power conductor is below a predetermined threshold value.

10. The invention according to claim 9 and further including means for charging said energy storage means from the electromagnetic field associated with said conductor.

11. The invention according to claim 9 and further including means for charging said energy storage means from the electromagnetic and electrostatic field associated with said conductor and said metallic housing.

12. The invention according to claim 11 and further including means carried by each of said sensor modules for generating an indicating signal when current flow through the associated conductor is below said threshold value.

13. The invention according to claim 12 wherein said transmitting means includes an RF transmitter and means for regulating the frequency of transmissions.

14. The invention according to claim 13 and further including means responsive to the presence of said indicating signal for a predetermined, continuous period of time to reduce said frequency of transmissions.

15. The invention according to claim 14 and further including means carried by each of said modules for sensing voltage on said associated power conductor with no current in said associated power conductor and for providing a signal indicating the no current condition.

16. The invention according to claim 15 including means for electrostatically charging said battery when no current is flowing through said power conductor and data is not being transmitted from said device.

17. The invention according to claim 1 and further including means carried by each of said sensor modules for deriving electrical power from the electromagnetic field associated with current flow through said power conductor for powering all sensor module electronics.

18. The invention according to claim 1 and further including conductor temperature measurement means carried by each of said modules and including a temperature probe having a portion in direct contact with the associated conductor to measure the temperature thereof and means for avoiding any influence on said temperature measurement due to heat from said sensor module and solar sources.

19. The invention according to claim 18 and further including means carried by each of said sensor modules for measuring ambient temperature of the air immediately adjacent the associated conductor.

20. The invention according to claim 19 wherein said avoiding means comprise a protective shroud surrounding at least a portion of said temperature probe.

21. A system for monitoring a plurality of parameters associated with each of a plurality of energized electrical power conductors for complete installation and removal while said conductors are energized, said system comprising:
(a) a plurality of sensor modules, one of said modules being mounted upon each of said energized conductors;
(b) means carried by each of said modules for sensing values of a plurality of parameters of the associated power conductor;
(c) means carried by each of said modules for identifying, processing and storing said sensed values;
(d) means carried by each of said modules for periodically transmitting a sequence of encoded signals in data bursts of predetermined duration from each of said plurality of sensor modules commensurate with each of said sensed values;
(e) means carried by each of said modules for controlling the starting times of said data bursts by said transmitting means of each of said modules to avoid simultaneous transmission, with consequent data collisions, by any two of said modules; and
(f) means remote from said modules for receiving said signals from each of said plurality of modules and decoding said signals to provide said parameter values at said remote means.

22. The invention according to claim 21 wherein said controlling means of each of said modules establishes said starting times for beginning transmission by said transmitting means in relation to a reference point on the voltage waveform which is chosen to be the same for all modules on conductors connected to the same phase of a common three-phase bus.

23. The invention according to claim 22 wherein said reference point is the zero crossing of the voltage on one phase of said common bus, said times for beginning transmissions by the modules on adjacent phases of each three-phase circuit is displaced by the successive zero crossings of each phase, and said duration of transmission by each module is less that the time between successive zero crossings of adjacent phases.

24. The invention according to claim 23 wherein predetermined times for successive transmissions from each module are an integral multiple of elapsed voltage cycles.

25. The invention according to claim 24 wherein said integral multiple is different for each of said modules and does not have a common denominator with said integral multiple of any other module.

26. The invention according to claim 21 and further including an RF transmitter and antenna for transmitting signals on a second frequency from a location remote from said modules, and an RF receiver and antenna carried by each of said modules for receiving signals at said second frequency.

27. The invention according to claim 26 wherein said signals transmitted on said second frequency are encoded to provide an address unique to each of said modules including its assigned time slot for transmitting said sequence of signals on said first frequency.

28. The invention according to claim 21 wherein said controlling means includes means for detecting zero-crossings of conductor current and voltage, said data transmitting means includes means to transmit a message of predetermined duration in synchronization with said voltage zero crossing.

* * * * *